(12) United States Patent
Kang et al.

(10) Patent No.: US 9,722,181 B2
(45) Date of Patent: Aug. 1, 2017

(54) LAMINATE HAVING ORGANIC MASK AND METHOD FOR MANUFACTURING ORGANIC ELECTROLUMINESCENT DEVICE USING SAME

(71) Applicant: LG DISPLAY CO., LTD., Seoul (KR)

(72) Inventors: Minsoo Kang, Daejeon (KR); Hyunsik Park, Daejeon (KR); Sehwan Son, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/908,451

(22) PCT Filed: Aug. 19, 2014

(86) PCT No.: PCT/KR2014/007698
§ 371 (c)(1),
(2) Date: Jan. 28, 2016

(87) PCT Pub. No.: WO2015/026139
PCT Pub. Date: Feb. 26, 2015

(65) Prior Publication Data
US 2016/0197276 A1 Jul. 7, 2016

(30) Foreign Application Priority Data

Aug. 19, 2013 (KR) .................. 10-2013-0097702

(51) Int. Cl.
*H01L 51/00* (2006.01)
(52) U.S. Cl.
CPC ...... *H01L 51/0004* (2013.01); *H01L 51/0015* (2013.01); *H01L 51/0023* (2013.01)

(58) Field of Classification Search
CPC .................. H01L 51/0004–51/0097
See application file for complete search history.

(56) References Cited

U.S. PATENT DOCUMENTS

| | | | |
|---|---|---|---|
| 2005/0051770 | A1 | 3/2005 | Ando et al. |
| 2006/0169973 | A1 | 8/2006 | Isa et al. |
| 2007/0036887 | A1 | 2/2007 | Haase et al. |
| 2008/0261478 | A1 | 10/2008 | Cok et al. |
| 2012/0027950 | A1 | 2/2012 | Wakamatsu et al. |
| 2013/0149803 | A1 | 6/2013 | Moon et al. |
| 2014/0030830 | A1* | 1/2014 | Lee ..................... H01L 51/5268 438/29 |
| 2016/0218326 | A1* | 7/2016 | Fleissner ................ H01L 51/56 |

FOREIGN PATENT DOCUMENTS

| | | |
|---|---|---|
| CN | 101287856 A | 10/2008 |
| CN | 102130303 A | 7/2011 |
| JP | 07-235016 A | 9/1995 |
| JP | 2002367774 A | 12/2002 |
| JP | 2011176258 A | 9/2011 |
| JP | 2012164581 A | 8/2012 |
| KR | 20110088427 A | 8/2011 |
| KR | 20120076940 A | 7/2012 |
| TW | 201113649 A | 4/2016 |
| WO | 2013/045775 A1 | 4/2013 |

\* cited by examiner

*Primary Examiner* — Mamadou Diallo
(74) *Attorney, Agent, or Firm* — Dentons US LLP

(57) ABSTRACT

Provided are a laminate including an organic material mask and a method for preparing an organic light emitting device using the same. The laminate includes a substrate; and a mask provided on the substrate and including an organic material.

8 Claims, 1 Drawing Sheet

LAMINATE HAVING ORGANIC MASK AND METHOD FOR MANUFACTURING ORGANIC ELECTROLUMINESCENT DEVICE USING SAME

This application is a National Stage Entry of International Application No. PCT/KR2014/007698 filed Aug. 19, 2014, and claims the benefit of Korean Application No. 10-2013-0097702, filed on Aug. 19, 2013, all of which are hereby incorporated by reference in their entirety for all purposes as if fully set forth herein.

TECHNICAL FIELD

The present application relates to a laminate comprising an organic material mask and a method for preparing an organic light emitting device using the same.

BACKGROUND ART

Generally, in order to form a patterning layer, a thin film is formed by deposition, spin coating, or the like and then a pattern is indirectly formed by a photomasking process, or a pattern to be formed is directly printed on a substrate.

Meanwhile, recently, in a preparing process of a semiconductor device or a display device which requires a large area without using the photosensitive mask, in order to facilitate the process, a shadow mask which may simultaneously form the film and the pattern only by preparing the mask has been applied.

For the patterning, an alignment mark needs to exist at a predetermined position on the substrate, and after arranging the alignment mark and positions of alignment holes of the mask, the patterning process is performed.

The alignment mark which is an alignment criterion of the mask and the substrate is separately formed on the substrate before the patterning process, and generally, the metal layer is deposited and then patterned in cross, circular, and square shapes through the photo process, and as another method, the alignment mark is formed on the substrate by printing ink or directly by a laser.

That is, there is a problem in that an additional process for forming the alignment mark in addition to the present process of forming a multilayer is added.

DETAILED DESCRIPTION OF THE INVENTION

Technical Problem

An object of the present invention is to provide a laminate including an organic material mask with an improved process characteristic, and a method for preparing an organic light emitting device using the same.

Technical Solution

An exemplary embodiment of the present application provides a laminate including: a substrate; and a mask provided on the substrate and including an organic material.

Another exemplary embodiment of the present application provides a method for preparing an organic light emitting device including: forming one or more of a first electrode, an organic material layer, and a second electrode by using the laminate.

Advantageous Effects

According to the exemplary embodiment of the present application, by directly forming the organic material mask on the substrate by the printing method, since an alignment system in the vacuum evaporator during the deposition process of the organic material and the like on the substrate is not required and the weight of a logistics system may be reduced, the cost of the process may be reduced. Further, unlike the related art, since the substrate may move while the organic material mask is attached on the substrate, a problem that the mask is distorted when the substrate moves does not occur. Therefore, the present application may be more preferably applied when a large substrate is used, and more preferably applied in a roll to roll deposition system.

DESCRIPTION OF REFERENCE NUMERALS AND SIGN

Figure 1:
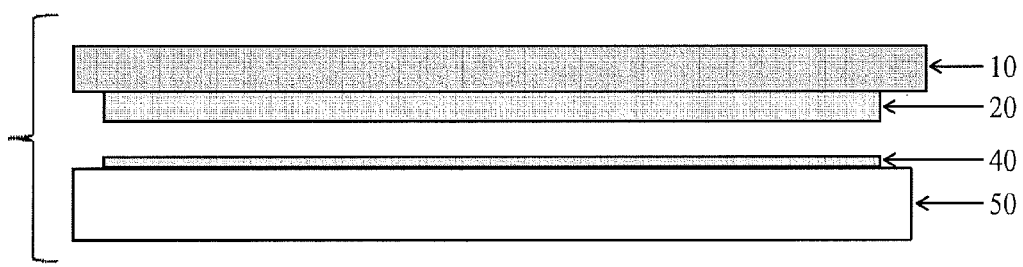
FIG. 1 is a diagram schematically illustrating a deposition process system using a shadow mask in the related art.

10: Substrate holder
20: Substrate
30: Organic material mask
40: Shadow mask
50: Shadow mask tray
60: First electrode
70: Organic material layer
80: Second electrode layer

BEST MODE

Hereinafter, the present application will be described in more detail.

FIG. 1 schematically illustrates a deposition process system using a shadow mask in the related art. As illustrated in FIG. 1, the deposition process system using the shadow mask in the related art uses a system in which a substrate 20 is attached to a substrate holder 10 and a shadow mask 40 is attached to a shadow mask tray 50.

In the related art, in order to deposit an organic material on a necessary portion on the substrate, the shadow mask is used. In this case, alignment between the substrate and the shadow mask is very important and needs to be precisely controlled. That is, an alignment system of aligning the substrate and the shadow mask in a vacuum evaporator is required.

Further, the substrate holder attaching the substrate and the shadow mask tray attaching the shadow mask are required, and there is a problem in that a weight of the process system is increased as the size of the substrate is increased. Accordingly, for precision of the alignment between the substrate and the shadow mask, it is necessary to overcome a sagging phenomenon of the substrate and/or the shadow mask.

Further, in the related art, since the distortion of the alignment due to vacuum and the like when the shadow mask system moves may be generated, in the art, improvement for the deposition process using a shadow mask system is needed.

As a result, a laminate according to an exemplary embodiment of the present application includes a substrate; and a mask provided on the substrate and including an organic material.

In the present application, in a process of depositing the organic material and the like on the substrate, an organic material mask is directly provided on the substrate without using a separate shadow mask system. That is, the organic material mask provided on the substrate may serve as a shadow mask.

In the exemplary embodiment of the present application, a material of the substrate may be properly selected depending on a field to which the laminate according to the present application is applied, and as a preferable example, glass, an inorganic material substrate, a plastic substrate, other flexible substrates, and the like are included, but the material is not limited thereto.

In the exemplary embodiment of the present application, the organic material mask may be formed on the substrate by a printing method. In more detail, the printing method may be performed by transferring and then firing the material forming the organic material mask on the substrate with a desired pattern shape. The transfer method is not particularly limited, but a pattern is formed on a pattern transfer medium such as an intaglio or a screen, and a desired pattern may be transferred on a conducting layer by using the formed pattern. The method of forming the pattern shape on the pattern transfer medium may use methods which are known in the art.

The printing method is not particularly limited, and may use printing methods such as offset printing, reverse offset printing, screen printing, gravure printing, and the like. The offset printing may be performed by primarily transferring a paste to a silicon rubber called a blanket after filling the paste in the intaglio where the pattern is engraved and then secondarily transferring the paste by contacting the blanket and the substrate. The screen printing may be performed by positioning the paste on the screen having the pattern and directly positioning the paste on the substrate through a hollow screen while pressing a squeegee. The gravure printing may be performed by winding a blanket engraved with the pattern on a roll, filling the paste in the pattern, and then transferring the filled paste onto the substrate. In the present application, the methods may be used alone or in combination. Further, other printing methods which are known to those skilled in the art may also be used.

In the case of a gravure offset printing method or a reverse offset printing method, since most of the ink or the paste is transferred onto the substrate due to a release property of the blanket, a separate blanket cleaning process is not required. The intaglio may be prepared by precisely etching the substrate. The intaglio may be prepared by etching a metal plate, or prepared through optical patterning with a polymer resin.

The material which may form the organic material mask may use a material which is known in the art if the material is a material that may form the mask by the printing method, and is not particularly limited. In more detail, the organic material mask may include one or more of polyimide, polyethylene, polyvinylchloride, and the like, but is not limited thereto.

Figure 2:
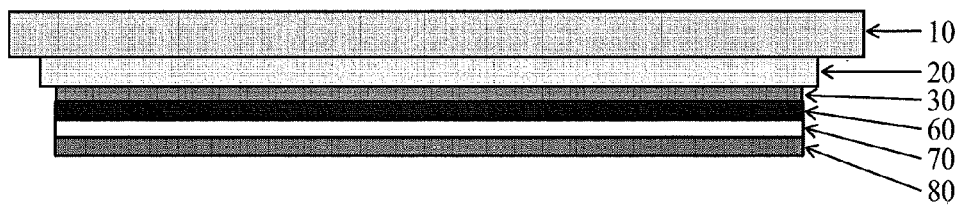
FIG. 2 is a diagram schematically illustrating a laminate including a shadow mask and a method for preparing an organic light emitting device by using the laminate according to an exemplary embodiment of the present application

A detailed example of the laminate according to the exemplary embodiment of the present application is illustrated in FIG. 2. According to FIG. 2, the laminate according to the exemplary embodiment of the present application includes a substrate 20; and a mask 30 provided on the substrate 20 and including an organic material.

The mask including the organic material may have a pattern shape, and may have a shape having a reversely tapered angle, but is not limited thereto. The shape having the reversely tapered angle may be prepared by two or more printing processes, but is not limited thereto.

Further, as illustrated in FIG. 2, a method for preparing an organic light emitting diode according to an embodiment of the present application includes forming one or more of a first electrode 60, an organic material layer 70, and a second electrode 80 by using the laminate.

In more detail, the method for preparing the organic light emitting diode according to the embodiment of the present application includes forming a mask 30 including an organic material on the substrate 20. Since the methods of forming the material of the organic material and the mask including the organic material are the same as described above, the detailed description thereof will be omitted.

In the exemplary embodiment of the present application, the method may include forming the first electrode 60, the organic material layer 70, and the second electrode 80 on the laminate including the substrate 20 and the mask 30 by a deposition process. In the process of forming the first electrode 60, the organic material layer 70, or the second electrode 80 through the deposition process, the laminate including the substrate 20 and the mask 30 may be used.

In the exemplary embodiment of the present application, the method may further include removing the mask including the organic material, after forming one or more of the first electrode, the organic material layer, and the second electrode.

For example, after the first electrode, the organic material layer, or the second electrode are formed on the laminate including the substrate and the mask by the deposition process, the mask including the organic material may be removed.

The method of removing the mask including the organic material may use methods which are known in the art, and in more detail, use a film delamination method, but is not limited thereto.

In the exemplary embodiment of the present application, the mask including the organic material may be removed, after forming the first electrode on the laminate including the substrate and the mask by the deposition process. Thereafter, the organic material layer and the second electrode are sequentially formed on the first electrode by using the method known in the art to prepare the organic light emitting device.

The first electrode may be formed with one or more kinds selected from magnesium, calcium, sodium, potassium, titanium, indium, yttrium, lithium, gadolinium, aluminum, platinum, gold, tungsten, tantalum, copper, silver, tin, and lead.

Further, the first electrode may be formed with a transparent conductive oxide. Here, the transparent conductive oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Jr), rhodium (Rh), ruthenium (Ru), tungsten (W), cobalt (Co), nickel (Ni), manganese (Mn), aluminum (Al), and lanthanum (La).

The first electrode may be formed by using any one physical vapor deposition (PVD) method selected from a sputtering method, an E-beam evaporation method, a thermal evaporation method, a laser molecular beam epitaxy (L-MBE) method, and a pulsed laser deposition (PLD) method; any one chemical vapor deposition method selected from a thermal chemical vapor deposition method, a plasma-enhanced chemical vapor deposition (PECVD) method, a light chemical vapor deposition method, a laser chemical vapor deposition method, a metal-organic chemical vapor deposition (MOCVD) method, and a hydride vapor phase epitaxy (HVPE) method; or an atomic layer deposition (ALD) method.

For improving the resistance of the first electrode, an auxiliary electrode may be further included. The auxiliary electrode may be formed with one or more kinds selected from a group consisting of a conductive sealant and a metal by using a deposition process or a printing process. In more detail, the auxiliary electrode may include at least one of Cr, Mo, Al, Cu, and an alloy thereof, but is not limited thereto.

An insulating layer may be further included on the auxiliary electrode. The insulating layer may be formed by using a material and a method which are known in the art. In more detail, the insulating layer may be formed by using a general photoresist material; polyimide; polyacryl; silicon nitride; silicon oxide; aluminum oxide; aluminum nitride; alkaline metal oxide; alkaline earth metal oxide, and the like, but is not limited thereto. The thickness of the insulating layer may be 10 nm to 10 µm, but is not limited thereto.

A detailed material and a forming method of the organic material layer are not particularly limited, and may use a material and a forming method which are widely known in the art.

The organic material layer may be prepared with a smaller number of layers by a solvent process, not a deposition method using various polymer materials, for example, a method such as spin coating, dip coating, doctor blading, screen printing, inkjet printing, or heat transfer method.

The organic material layer includes a light emitting layer, and may have a laminated structure including at least one selected from a hole injection layer, a hole transport layer, an electron transport layer, and an electron injection layer.

A material that may form the hole injection layer may be a material having a large work function so that the hole injection layer may be smoothly injected into the organic material layer. A detailed example of the hole injection material is a metal such as vanadium, chromium, copper, zinc, and gold or an alloy thereof; a metal oxide such as zinc oxide, indium oxide, indium tin oxide (no), or indium zinc oxide (IZO); a combination of metal and oxides such as ZnO:Al or SnO2:Sb; a conductive polymer such as poly(3-methyl thiophene), poly[3,4-(ethylene-1,2-dioxy)thiophene] (PEDT), polypyrrole, or polyaniline, but is not limited thereto.

A material that may form the electron injection layer may be generally a material having a small work function so that the electrons are easily injected into the organic material layer. A detailed example of the electron injection material includes metals such as magnesium, calcium, sodium, potassium, titanium, indium, yttrium, lithium, gadolinium, aluminum, silver, tin, and lead or alloys thereof; multilayered structure materials such as LiF/Al or LiO2/Al, or the like, and may use the same material as the hole injection electrode material, but is not limited thereto.

The material that may form the light emitting layer may be a material which has good quantum efficiency for fluorescence and phosphorescence, as a material that may emit light in a visible-light area by receiving and coupling the holes and the electrons from the hole transport layer and the electron transport layer. A detailed example includes 8-hydroxyquinoline aluminum complex (Alq3); a carbazole-based compound; a dimerized styryl compound; BAlq; a 10-hydroxybenzoquinoline-metal compound; benzoxazole, benzothiazole, and benzimidazole-based compounds; a poly (p-vinylene) (PPV)-based polymer; a spiro compound; poly-fluorene, rubrene; phosphorescent host CBP p[[4,4'-bis(9-carbazolyl)biphenyl]; or the like, but is not limited thereto.

Further, in order to improve a fluorescent and phosphorescent property, the light emitting material may further include a phosphorescent dopant or a fluorescent dopant. A detailed example of the phosphorescent dopant includes ir(ppy)(3)(fac tris(2-phenylpyridine) iridium), F2Irpic [iridium(III)bis(4,6-di-fluorophenyl-pyridinato-N,C2) picolinate], or the like. The fluorescent dopant may use materials which are known in the art.

The material that may form the electron transport layer may be a material having large mobility for the electron, as a material which may receive the electrons from the electron injection layer well to carry the received electrons to the light emitting layer. A detailed example includes an Al complex of 8-hydroxyquinoline; a complex including Alq3; an organic radical compound; a hydroxyflavone-metal complex, or the like, but is not limited thereto.

The second electrode may include at least one of Al, Ag, Ca, Mg, Au, Mo, Jr, Cr, Ti, Pd, and an alloy thereof, but is not limited thereto.

In the exemplary embodiment of the present application, the method may further include encapsulating the organic light emitting device. The encapsulation prevents a foreign substance such as oxygen, moisture, or the like from penetrating into the organic light emitting device, and may be performed by using a material, a method, and the like which are known in the art.

The encapsulating process may be performed by forming a sealing part covering the outside of the organic light emitting device.

As long as the sealing part may seal the organic light emitting device while covering the outside of the organic light emitting device, a material thereof is not particularly limited. For example, the sealing part is formed by pressing the outside of the organic light emitting device by an encapsulation film or depositing metal or metal oxide, or the sealing part may be formed by coating and curing a resin composition.

Further, the sealing part may be formed by depositing metal or metal oxide by an atomic layer deposition (ALD) method. Here, a formed metal layer or metal oxide layer may have a structure having two or more layers.

Further, an exemplary embodiment of the present application provides an organic light emitting device prepared by the method for preparing the organic light emitting device. The organic light emitting device may be a flexible organic light emitting device.

The organic light emitting device according to the exemplary embodiment of this specification may include a light extraction structure. In more detail, the organic light emitting device may additionally include a light extraction layer between the substrate and the organic light emitting device.

The light extraction layer is not particularly limited if the light extraction layer has a structure that may improve light extraction efficiency of the organic light emitting device by inducing light scattering. In more detail, the light extraction layer may have a structure in which scattering particles are distributed in a binder.

Further, the light extraction layer may be directly formed on the substrate by a method such as spin coating, bar coating, and slit coating, or formed by a method of preparing and attaching the light extraction layer in a film form.

Further, a planarization layer may be further included on the light extraction layer.

Further, an exemplary embodiment of the present application provides a display device including the organic light emitting device. In the display device, the organic light emitting device may serve as a pixel or a backlight. Other configurations of the display device which are known in the art may be applied.

Further, an exemplary embodiment of the present application provides an illumination device including the organic light emitting device. In the illumination device, the organic light emitting device serves as a light emitting unit. Other configurations required for the illumination device which are known in the art may be applied.

According to the exemplary embodiment of the present application, the organic material mask may serve as the shadow mask in the related art, by directly forming the organic material mask on the substrate by the printing method. As a result, since an alignment system in the vacuum evaporator during the deposition process of the organic material and the like on the substrate is not required and the weight of a logistics system may be reduced, the cost of the process may be reduced.

Further, unlike the related art, since the substrate may move while the organic material mask is attached on the substrate, a problem that the mask is distorted when the substrate moves does not occur. Accordingly, the present application may be more preferably applied when a large substrate is used, and more preferably applied in a roll to roll deposition system.

The invention claimed is:

1. A method for preparing an organic light emitting device, comprising:
    preparing a substrate;
    patterning a mask including an organic material on the substrate;
    depositing one or more of a first electrode, an organic material layer, and a second electrode on the substrate and the mask; and
    removing the mask,
    wherein the mask has a pattern shape and the mask has a shape of reversely tapered angle.

2. The method of claim 1, wherein the substrate is glass, an inorganic material substrate, a plastic substrate, or a flexible substrate.

3. The method of claim 1, wherein the organic material includes one or more selected from a group consisting of polyimide, polyethylene, and polyvinylchloride.

4. The method of claim 1, wherein the mask including the organic material is formed on the substrate by a printing method.

5. The method of claim 1, wherein further comprising:
    forming an auxiliary electrode on the first electrode,
    wherein the auxiliary electrode includes at least one of Cr, Mo, Al, Cu, and an alloy thereof.

6. The method of claim 5, wherein further comprising:
    forming an insulating layer on the auxiliary electrode,
    wherein the insulating layer includes at least one of a general photoresist material, polyimide, polyacryl, silicon nitride, silicon oxide, aluminum oxide, aluminum nitride, alkaline metal oxide, alkaline earth metal oxide.

7. The method of claim 6, wherein a thickness of the insulating layer is one of 10 nm to 10 µm.

8. The method of claim 1, wherein the shape of reversely tapered angle is prepared by two or more printing processes.

* * * * *